United States Patent
Rajeswaran et al.

(10) Patent No.: US 6,614,171 B2
(45) Date of Patent: Sep. 2, 2003

(54) LIGHT-PRODUCING DISPLAY HAVING SPACED APART TILES

(75) Inventors: Gopalan Rajeswaran, Fairport, NY (US); Henry R. Freidhoff, Rochester, NY (US); Giana M. Phelan, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 390 days.

(21) Appl. No.: 09/757,921

(22) Filed: Jan. 10, 2001

(65) Prior Publication Data

US 2002/0130987 A1 Sep. 19, 2002

(51) Int. Cl.[7] .......................... H05B 33/00; H05B 33/02
(52) U.S. Cl. ...................... 313/500; 313/505; 349/69; 349/73; 345/76; 345/55
(58) Field of Search ................. 313/495, 498, 313/500, 505; 345/76, 55; 315/169.3; 349/69, 73

(56) References Cited

U.S. PATENT DOCUMENTS

| 4,885,211 | A | | 12/1989 | Tang et al. | 428/457 |
|---|---|---|---|---|---|
| 5,056,893 | A | | 10/1991 | Holz et al. | 359/54 |
| 5,059,062 | A | | 10/1991 | Bresnahan | 404/110 |
| 5,661,531 | A | | 8/1997 | Greene et al. | 359/40 |
| 5,776,622 | A | | 7/1998 | Hung et al. | 428/690 |
| 5,903,328 | A | | 5/1999 | Greene et al. | 349/73 |
| 6,014,193 | A | * | 1/2000 | Taira et al. | 349/73 |
| 6,055,030 | A | * | 4/2000 | Izumi | 349/73 |

* cited by examiner

*Primary Examiner*—Ashok Patel
*Assistant Examiner*—Mariceli Santiago
(74) *Attorney, Agent, or Firm*—Raymond L. Owens

(57) ABSTRACT

A display including at least two tiles which are aligned along one edge of each tile but are spaced from each other, each tile having electric field activatable pixels which produce light, each tile including and are spaced from their aligned edge, and a back plate aligned with the two tiles and having electric field activatable pixels which are disposed so that they are positioned in the space provided between the aligned tiles whereby, when pixels on the two tiles and the back plate are activated, a seamless image is produced.

7 Claims, 5 Drawing Sheets

SECTION A-A

SECTION A-A

LIGHT-PRODUCING DISPLAY HAVING SPACED APART TILES

FIELD OF THE INVENTION

The present invention relates generally to displays which include a plurality of tiles, which are aligned to produce an image.

BACKGROUND OF THE INVENTION

Previously when smaller array displays with separately addressable pixels are tiled to form a larger monolithic display, edge pixels of adjacent tiles had to be spaced at the distance of the pixels on each display tile; thus, adjacent tile edges must fall within the space between adjacent pixels. This space is small for high resolution displays and makes fabrication and assembly difficult and costly.

U.S. Pat. No 5,661,531 describes a tiling method for LCD displays where the adjacent edges of the tiles must fall within the space between adjacent pixels on the adjacent tiles. This space is a small fraction of the pixel pitch in either the x or y direction.

U.S. Pat. No. 5,056,893 describes a method where the adjacent pixels on tiled LCD displays are smaller than the non-adjacent pixels to allow more room for the adjacent edges of the tiled LCDs. The increase is space is only as large as the material removed from the adjacent pixels.

U.S. Pat. No. 5,673,091 describes tiled LCDs that are tipped at an angle and overlap adjacent tiles to eliminate interference of adjacent edges. Pixels of these LCDs are not on the same display plane, and the technique will only work with one row of tiled displays.

U.S. Pat. 5,903,328 describes tiled LCD displays where the adjacent tile edges are ground at an angle and overlap each other. This allows a small increase in the space for the ground edge relative to the adjacent pixels; however, as the space increases the distance between the image planes of adjacent tiles increases proportionally.

Small deviations in pixel uniformity are perceived by the viewer as defects in the display. Pixels must appear to the eye to be the same size and at the same plane across the tiles to provide a seamless display. In addition, pixels must maintain uniform periodic spacing, and uniform color and luminosity across the tiles to provide a seamless display.

SUMMARY OF THE INVENTION

It is an object of the present invention to provide an effective tiled display in which images, which are produced, are seamless to the viewer.

This object is achieved by a display, comprising:
  a) at least two tiles which are aligned along one edge of each tile but are spaced from each other, each tile having electric field activatable pixels which produce light, each tile have said pixels spaced from their aligned edge; and
  b) a back plate aligned with the two tiles and having electric field activatable pixels which are disposed so that they are positioned in the space provided between the aligned tiles whereby, when pixels on the two tiles and the back plate are activated, a seamless image is produced.

ADVANTAGES

It is an advantage of the present invention that an image from a tiled display is seamless. This is accomplished by using the back plate to fill in pixels between spaced but aligned tiles.

It is a further advantage of the present invention that the increased space allowed between tiles reduces the accuracy requirement for tile placement. Furthermore, the requirements for tile edge finishing are less constrained.

The present invention is particularly suitable for use in organic electroluminescent displays. A feature of the invention is that it can be readily manufactured and the display will not produce artifacts caused by aligned tiles.

DETAILED DESCRIPTION OF THE INVENTION

Figures 1, 2:
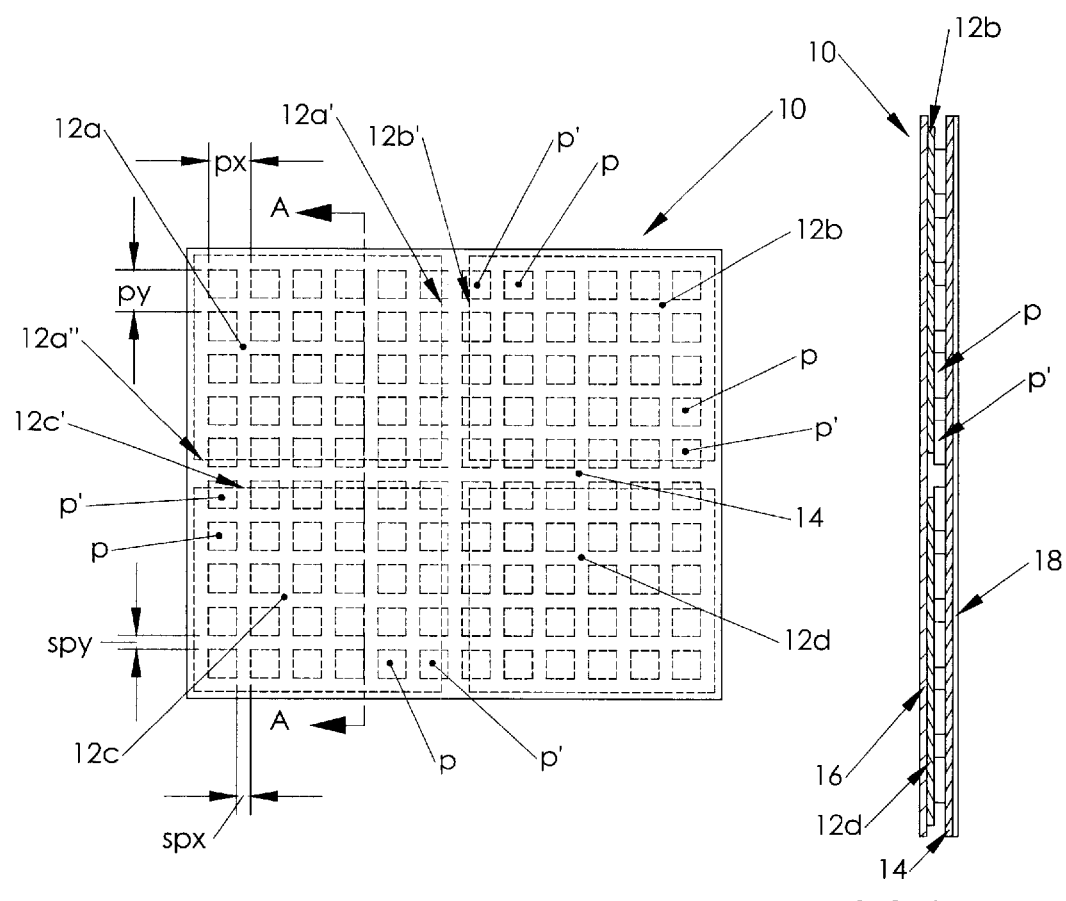
FIG. 1 is a front view of a display in accordance with the present invention having aligned tiles.
FIG. 2 is a sectional view taken along the lines A—A of FIG. 1.

Turning now to FIG. 1 which shows a display 10 in accordance with the present invention that has four aligned tiles 12a–12d, respectively. It will be understood that, in order to practice the invention, two or more tiles aligned along at least one edge are necessary. Each of the tiles is aligned along one edge of each of the tiles but are spaced from each other. This is clearly shown in FIG. 1 where the edge 12a' and 12a" are aligned with respect to edges 12b' and 12c" of tiles 12b and 12c, respectively. As will be explained in more detail later with respect to FIGS. 5, 6, and 7, each tile has electric field activatable pixels p which produce light and such pixels being spaced from their aligned edge. Although it is preferable that the aligned edges be parallel, it will be understood that they can be slightly out of parallel as long as the pixels on the tiles line up to produce a seamless image as will be subsequently described.

As shown in FIG. 2, the display 10 includes a back plate 14 aligned with the four tiles 12a–12d and having electric field activatable pixels p' which are disposed so that they are positioned in the space provided between the aligned tiles 12a–12d whereby, when pixels p on the four tiles 12a–12d and the back plate 14 are activated, a seamless image is produced. The back plate 14 is aligned with the four tiles 12a–12d and having electric field activatable pixels p' which are disposed so that they are positioned in the space provided between the aligned tiles whereby, when pixels p on the four tiles 12a–12d and the back plate 14 are activated, a seamless image is produced.

The tiles 12a–12d are affixed to the back plate 14 along the perimeter by adhesive or other bonding means. In a further embodiment, the tiles 12a–12d are positioned between the back plate 14 and a front plate 16. The tiles 12a–12d can be affixed to either the back plate 14 or front plate 16. Alternatively, the back plate 14 and front plate 16 are sealed around the perimeter enclosing the tile array within. In another arrangement, a desiccant may also be positioned in or near any of the seals previously described. An oxygen getter can be disposed in or near any of the seals previously described.

Furthermore, a polarization film 18 can be attached to the back plate 14 or the front plate 16 as needed to increase the contrast ratio of the tiled display 10.

Figure 3:
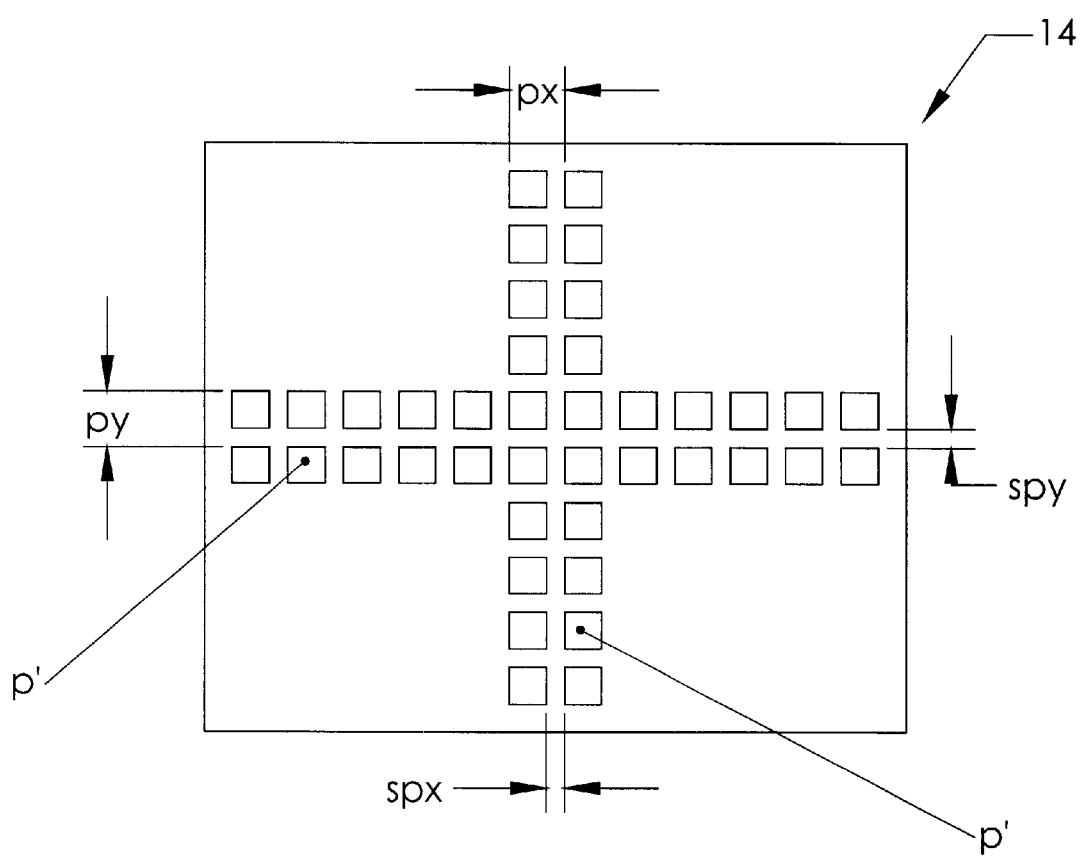
FIG. 3 is a front view of a back plate used in the display of FIG. 1.
Figure 4:
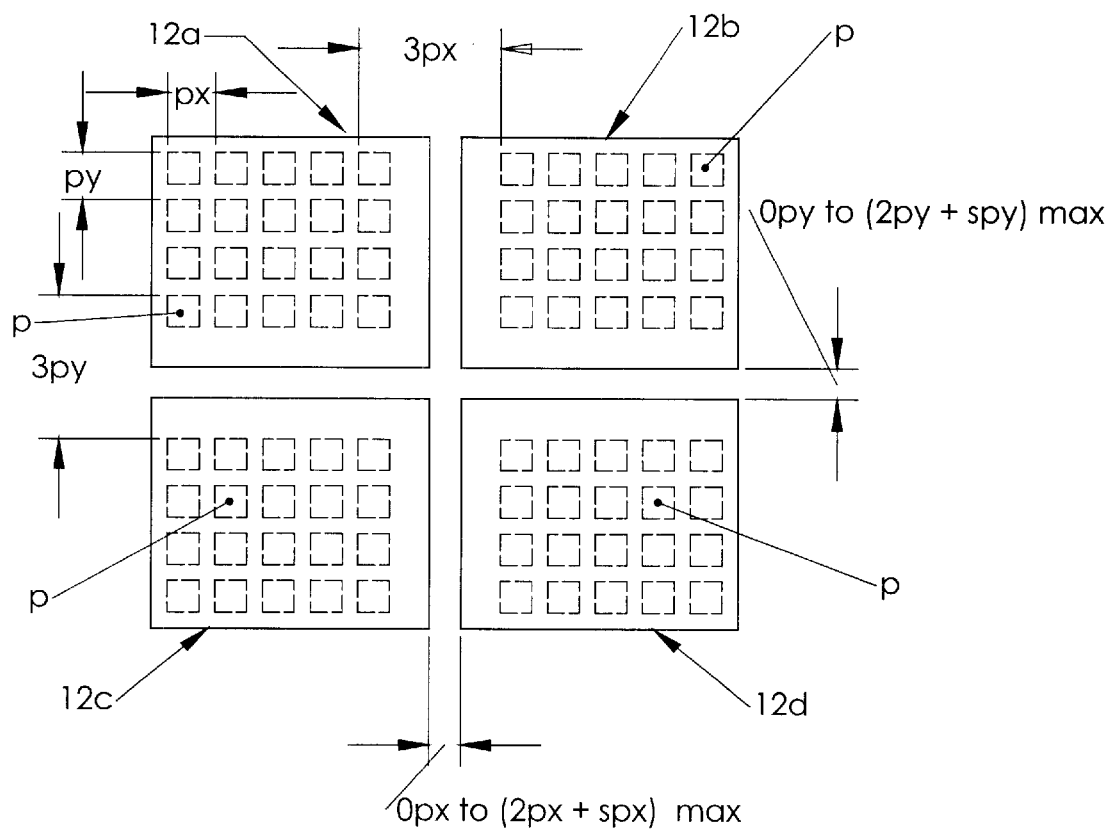
FIG. 4 is a front view showing four tiles and depicting the row and column pitch, respectively, of the pixels of the display of FIG. 1.

Equal pixel to pixel pitches in the x and y direction px and py, respectively, and equal pixel edge to adjacent pixel edge spacing in the x and y direction spx and spy, respectively, are shown in FIGS. 1, 3, and 4 for both the tiles and the back plate. The terms "spx" and "spy" refer to the spacing between pixels on a tile in the x and y direction, respectively. Furthermore, the tile edge pixel to an adjacent tiled edge pixel in an adjacent tile is shown in the x and y directions as 3px and 3py. The ranges of allowable gap spacing in the x and y direction between adjacent tiles 0 px to (2 px+spx) and 0 py (2 py+spy), respectively, are shown in FIG. 4.

The tiled pixels can include different dyes to produce different colors. These tiled color pixels can be patterned to form a completely colored image when viewed by a user and each one of them is individually addressable. Typical color combinations are red, green, and blue.

Figure 5:
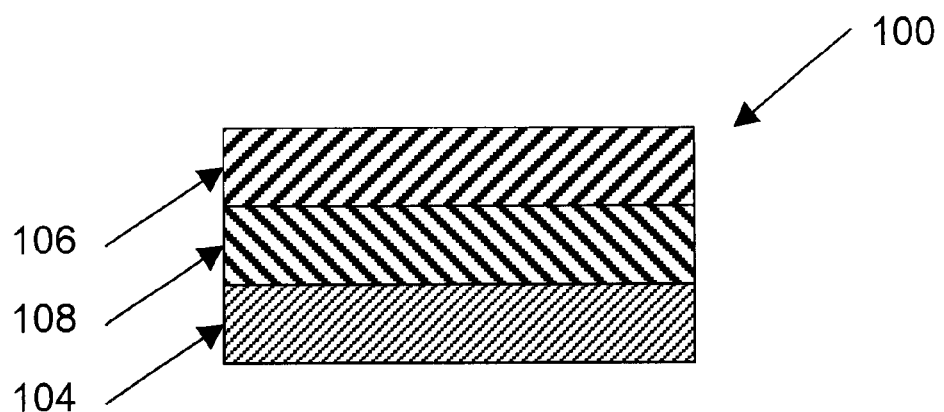
FIG. 5 is a simple pixel structure for organic light-emitting material.
Figure 6:
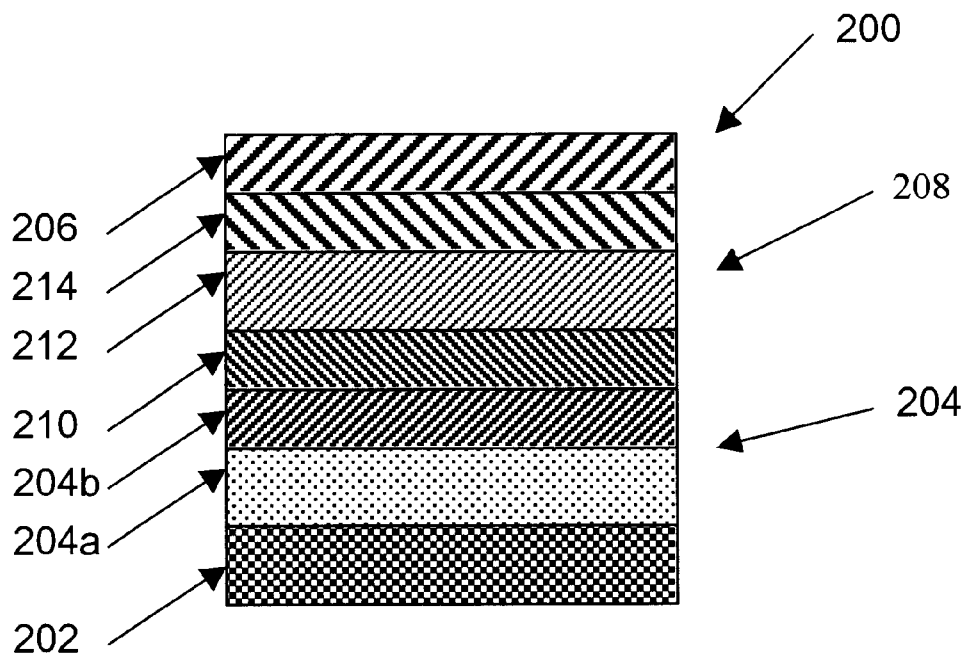
FIG. 6 is a multilayer pixel structure for organic light-emitting material in which light is reflected off the cathode and through the substrate.
Figure 7:
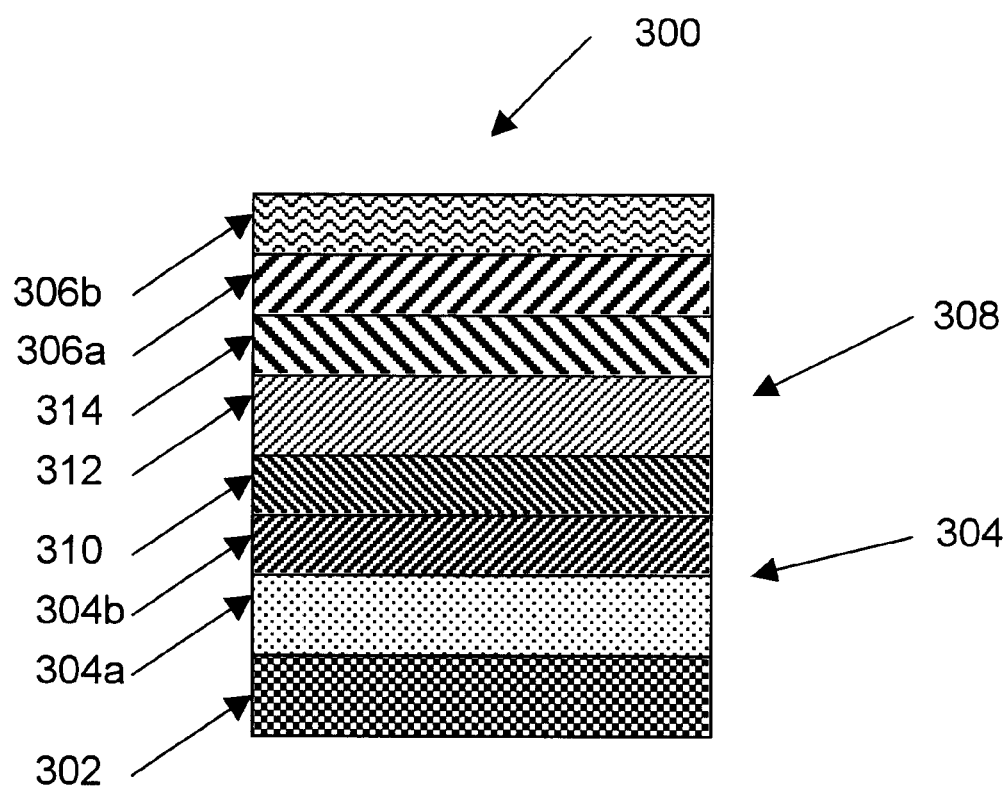
FIG. 7 is a multilayer pixel structure for organic light-emitting material in which light is transmitted through the cathode.

The present invention is particularly suitable for use in organic electroluminescent displays. FIGS. 5, 6, and 7 describe examples of tiles that have organic electroluminescent materials.

A light-emitting layer of an organic EL tile comprises a luminescent or fluorescent material where electroluminescence is produced as a result of electron-hole pair recombination in this region. In a simplest construction of a tile 100, as shown in FIG. 5, a light-emitting layer 108 is sandwiched between anode 104 and cathode 106. The light-emitting layer 108 is a pure material with a high luminescent efficiency. A well known material is tris (8-quinolinato) aluminum, (Alq), which produces excellent green electroluminescence.

The simple structure can be modified to a multilayer structure in which an additional electroluminescent layer is introduced between the hole and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable EL color as well as high luminance efficiency. Likewise, the electron and hole transport layers can be optimized primarily for the carrier transport property.

Turning to FIG. 6, a multilayer organic light-emitting device 200 has a light-transmissive substrate 202 on which is disposed a light-transmissive anode 204. The anode 204 comprises two layers 204a and 204b. An organic light-emitting structure 208 is formed between the anode 204 and a cathode 206. The organic light-emitting structure 208 is comprised of, in sequence, an organic hole-transporting layer 210, an organic light-emitting layer 212, and an organic electron-transporting layer 214. When an electrical potential difference (not shown) is applied between the anode 204 and the cathode 206, the cathode 206 will inject electrons into the electron-transporting layer 214, and the electrons will migrate across layer 214 to the light-emitting layer 212. At the same time, holes will be injected from the anode 204 into the hole-transporting layer 210. The holes will migrate across layer 210 and recombine with electrons at or near a junction formed between the hole-transporting layer 210 and the light-emitting layer 212. When a migrating electron drops from its conduction band to a valance band in filling a hole, energy is released as light, and is emitted through the light-transmissive anode 204 and substrate 202.

The organic EL devices can be viewed as a diode, which is forward biased when the anode is at a higher potential than the cathode. The anode and cathode of the organic EL device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. 5,059,062 is another preferred cathode construction. Hung et al. in U.S. Pat. No. 5,776,622 has disclosed the use of a if/Al bilayer to enhanced electron injection in organic EL devices.

Conventional anodes 204a are formed of a conductive and transparent oxide. Indium tin oxide has been widely used as the anode contact because of its transparency, good conductivity, and high work function.

Turning to FIG. 7, a multilayer organic device 300 emitting light from the top, has a substrate 302 on which is disposed a light reflective conductive anode 304. The anode 304 comprises two layers including a light reflective conductive metal layer 304a and a thin transparent layer of a conductive high work function material 304b. An organic light-emitting structure 308 is formed between the anode 304 and a cathode 306. The cathode 306 is composed of two layers including a thin transparent conductive layer of a low work function material 306a and a transparent conductive layer such as indium tin oxide 306b. The organic light-emitting structure 308 is comprised of, in sequence, an organic hole-transporting layer 310, an organic light-emitting layer 312, and an organic electron-transporting layer 314. When an electrical potential difference (not shown) is applied between the anode 304 and the cathode 306, the cathode will inject electrons into the electron-transporting layer 314, and the electrons will migrate across layer 314 to the light-emitting layer 312. At the same time, holes will be injected from the anode 304 into the hole-transporting layer 310. The holes will migrate across layer 310 and recombine with electrons at or near a junction formed between the hole-transporting layer 310 and the light-emitting layer 312. When a migrating electron drops from its conduction band to a valence band in filling a hole, energy is released as light, and is emitted through the light-transmissive cathode 306.

The invention has been described in detail with particular reference to certain preferred embodiments thereof, but it will be understood that variations and modifications can be effected with the spirit and scope of the invention.

| PARTS LIST | |
|---|---|
| 10 | display |
| 12a | aligned tile |
| 12b | aligned tile |
| 12c | aligned tile |
| 12d | aligned tile |

-continued

PARTS LIST

| | |
|---|---|
| 12a' | edge |
| 12a" | edge |
| 12b' | edge |
| 12c' | edge |
| 14 | back plate |
| 16 | front plate |
| 18 | polarization film |
| p | electric field activatable pixels |
| p' | electric field activatable pixels |
| 100 | tile |
| 104 | anode |
| 106 | cathode |
| 108 | light-emitting layer |
| 200 | light-emitting device |
| 202 | light-transmissive substrate |
| 204 | light-transmissive anode |
| 204a | layer |
| 204b | layer |
| 206 | cathode |
| 208 | organic light-emitting structure |
| 210 | organic hole-transporting layer |
| 212 | organic light-emitting layer |
| 214 | organic electron-transporting layer |
| 300 | multilayer organic device |
| 302 | substrate |
| 304 | light reflective conductive anode |
| 304a | light reflective conductive metal layer |
| 304b | conductive high work function material |
| 306 | cathode |
| 306a | low work function material |
| 306b | indium tin oxide |
| 308 | organic light-emitting structure |
| 310 | organic hole-transporting layer |
| 312 | organic light-emitting layer |
| 314 | organic electron-transporting layer |

What is claimed is:

1. A display, comprising:

a) at least two tiles which are aligned along one edge of each tile but are spaced from each other, each tile having electric field activatable pixels which produce light, each tile having said pixels spaced from their aligned edge; and b) a back plate aligned with the two tiles and having electric field activatable pixels which are disposed so that they are positioned in the space provided between the aligned tiles whereby, when pixels on the two tiles and the back plate are activated, a seamless image is produced.

2. The display of claim 1 wherein there are four tiles aligned in a rectangle so that each tile has two aligned edges which are spaced from adjacent tiles and wherein the back plate includes field activatable pixels positioned in the space between aligned tiles.

3. The display of claim 2 wherein the pixels in the four aligned tiles are electroluminescent pixels which are individually addressable.

4. The display of claim 2 wherein the pixels in each tile are arranged in columns and rows and having the same predetermined pitch between columns and rows, respectively, and wherein the pixels in the back plate have the same pitch corresponding to rows and columns so that a seamless image is produced.

5. The display of claim 4 wherein an image is produced that can be viewed from the front or back side of the display.

6. The display of claim 3 wherein the pixels on the tiles are arranged as an active matrix and the pixels on the back plate are arranged as a passive matrix.

7. The display of claim 5 wherein a polarization layer is provided over the side of the viewed display.

* * * * *